United States Patent
Oh et al.

(10) Patent No.: US 10,948,520 B2
(45) Date of Patent: Mar. 16, 2021

(54) CONNECTOR PIN DEVICE FOR TESTING SEMICONDUCTOR CHIP AND METHOD OF MANUFACTURING SAME

(71) Applicants: Jaesuk Oh, Gwangmyeong-si (KR); Kyungsook Lim, Guri-si (KR)

(72) Inventors: Jaesuk Oh, Gwangmyeong-si (KR); Kyungsook Lim, Guri-si (KR)

( * ) Notice: Subject to any disclaimer, the term of this patent is extended or adjusted under 35 U.S.C. 154(b) by 231 days.

(21) Appl. No.: 16/250,101

(22) Filed: Jan. 17, 2019

(65) Prior Publication Data
US 2019/0146005 A1 May 16, 2019

Related U.S. Application Data

(63) Continuation of application No. PCT/KR2017/007450, filed on Jul. 12, 2017.

(30) Foreign Application Priority Data

Jul. 29, 2016 (KR) ........................ 10-2016-0096642

(51) Int. Cl.
*G01R 1/067* (2006.01)
*G01R 31/28* (2006.01)
(Continued)

(52) U.S. Cl.
CPC ............ *G01R 1/06733* (2013.01); *G01R 1/04* (2013.01); *G01R 1/0433* (2013.01); *G01R 1/067* (2013.01);
(Continued)

(58) Field of Classification Search
CPC ........ G01R 1/06; G01R 1/07; G01R 1/06733; G01R 1/067; G01R 1/06716;
(Continued)

(56) References Cited

U.S. PATENT DOCUMENTS 8,975,906 B2* 3/2015 Jeong ................. G01R 1/06722
324/754.03
2006/0073710 A1* 4/2006 Hwang .............. H01R 13/2421
439/66
(Continued)

FOREIGN PATENT DOCUMENTS

JP 2015-158490 A 9/2015
KR 10-1998-0085880 A 12/1998
(Continued)

*Primary Examiner* — Son T Le
(74) *Attorney, Agent, or Firm* — Rabin & Berdo, P.C.

(57) ABSTRACT

A connector pin device includes a test socket body made of a flexible insulating material and including a pin mounting part in which mounting holes have been formed and a support part supporting the pin mounting part, sliding contact pins respectively formed in the mounting holes and each including a first contact pin having a first end externally exposed and a second end located within the mounting hole and a second contact pin having a first end externally located on the side opposite the first end of the first contact pin and a second end located within the mounting hole, wherein the first and second ends of the first and the second contact pins are provided to slide and come into contact with each other, and an cavity portion formed in a portion where the second ends of the sliding contact pins in the mounting hole are located.

9 Claims, 9 Drawing Sheets

(51) Int. Cl.
*G01R 1/04* (2006.01)
*G01R 1/073* (2006.01)
(52) U.S. Cl.
CPC ......... *G01R 1/07378* (2013.01); *G01R 31/28* (2013.01); *G01R 31/2886* (2013.01)
(58) Field of Classification Search
CPC ...... G01R 1/06722; G01R 31/28; G01R 1/04; G01R 1/0433; G01R 1/073; G01R 1/07378; G01R 31/2886; G01R 1/07371; G01R 1/06772; G01R 31/2822
See application file for complete search history.

(56) References Cited

U.S. PATENT DOCUMENTS

| | | | | |
|---|---|---|---|---|
| 2009/0140759 | A1* | 6/2009 | Hsiao | H01R 12/714 324/756.02 |
| 2009/0311886 | A1* | 12/2009 | Hsieh | G01R 1/06722 439/66 |
| 2010/0123476 | A1* | 5/2010 | Kazama | G01R 1/06772 324/755.01 |
| 2015/0247882 | A1 | 9/2015 | Lee et al. | |
| 2017/0229802 | A1 | 8/2017 | Kazama et al. | |

FOREIGN PATENT DOCUMENTS

| | | |
|---|---|---|
| KR | 10-2008-0018520 A | 2/2008 |
| KR | 20-2009-0001553 U | 2/2009 |
| KR | 10-2011-0061998 A | 6/2011 |
| KR | 10-1311752 B1 | 9/2013 |
| WO | WO 2016-021723 A1 | 2/2016 |

\* cited by examiner

CONNECTOR PIN DEVICE FOR TESTING SEMICONDUCTOR CHIP AND METHOD OF MANUFACTURING SAME

CROSS REFERENCE TO RELATED APPLICATION

The present application is a continuation application of International Application No. PCT/KR2017/007450 filed on Jul. 12, 2017, which is based upon and claims the benefit of Korean Patent Application No. 10-2016-0096642 filed in the Korean Intellectual Property Office on Jul. 29, 2017, the entire contents of which are incorporated herein by reference.

BACKGROUND OF THE INVENTION

1. Technical Field

The present invention relates to a connector pin device for testing a semiconductor chip and a method of manufacturing the same and, more particularly, to a connector pin device for testing a semiconductor chip, which is capable of performing the electrical characteristics of a semiconductor chip reliably and stably and improving an economic feasibility by extending durability lifespan, and a method of manufacturing the same.

2. Description of the Related Art

In general, the distance between electrical conduction parts that transfer the signal of a semiconductor is narrowed to 0.30 mm or less with the help of the semiconductor technology. As the function of the semiconductor is diversified, the number of conduction parts of a semiconductor device has increased to several hundreds to several thousands of connection parts. Furthermore, a frequency characteristic of the semiconductor has been improved as the speed of the semiconductor is increased. Accordingly, there is a need for an electrical connection connector capable of replacing an existing spring pin.

Accordingly, spring pins of various forms have been developed, and the pogo pin of the spring pins is representatively described below.

Figure 1:
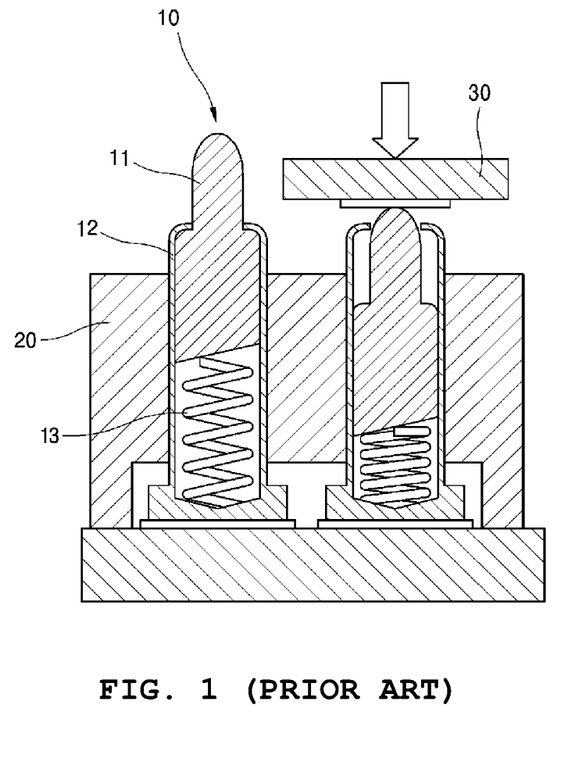
FIG. 1 is a cross-sectional view showing an example of the structure of a conventional pogo pin.
Figure 2:
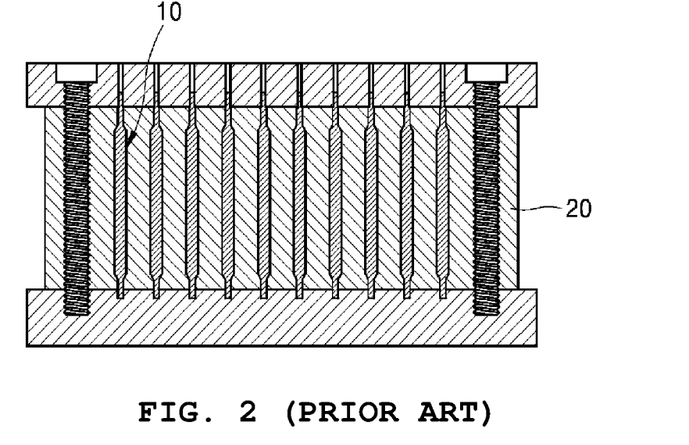
FIG. 2 is a cross-sectional view showing a housing to which the conventional pogo pins are fixed.

FIG. 1 is a cross-sectional view showing an example of the structure of a conventional pogo pin, and FIG. 2 is a cross-sectional view showing a housing to which the conventional pogo pins are fixed.

As shown in FIGS. 1 and 2, the conventional pogo pin 10 includes a plunger 11, a barrel 12 and a coil spring 13.

Each barrel 12 is configured to be fixed to the upper and lower parts of the plunger 11 so that the plunger 11 is not pulled out due to pressure pushed by the spring 13. The pogo pin 10 having such a structure is fixed to a predetermined location so that it comes into contact with a conduction part of a semiconductor. In this case, holes are formed in plastic, that is, a nonconductor at specific distances, and the pogo pins are inserted into the holes and then fixed so that they are not pulled out.

Recently, due to the characteristics of the semiconductor, if the distance between the conduction parts is 0.3 mm or less, the distance between the holes is 0.1 mm or less, which makes processing very difficult. Furthermore, if the number of pogo pins is several hundred to several thousands, there is a problem in that a processing cost is increased when the pogo pins are fixed using a two-stage to upper and lower covers.

Furthermore, in the structure in which the plunger 11 must be inserted into the barrel 12, the external diameter of the barrel 12 including the spring 13 must be increased. Accordingly, in the case of a fine pitch (e.g., 0.4 mm or less), there is a problem in that a processing cost rises due to precision processing because the distance between the holes is narrowed by the processing of the plastic housing 20 for fixing the pogo pins 10.

Furthermore, in the conventional structure, the diameter of the plunger 11 is formed to be further small, that is, 0.15 mm or less, and the plunger must be repeatedly used tens of thousands of to hundreds of thousands of times. It is however difficult to apply the plunger to a test for a semiconductor of a fine pitch because the plunger is damaged due to poor durability. Furthermore, there is a problem in that the elasticity of the spring is lost due to an overcurrent applied to the spring because the spring becomes thin and slim as the distance between the conduction parts is reduced.

Furthermore, in the pogo pin configured as described above, the plunger 11 is inserted into the barrel 12 and connected to the coil spring 13. Accordingly, the number of contact points is increased and a signal is transferred through the coil spring 13.

Accordingly, the conventional pogo has a problem in that it has the structure not suitable for testing a high-frequency semiconductor because a signal is transferred through the coil spring 13 having a long length and a spiral shape and thus interference and attenuation of a high frequency signal exceeds a specific level.

PRIOR ART DOCUMENT

Patent Document (Patent Document 1) (Document 1) Korean Patent Application Publication No. 10-1998-0085880 (Dec. 5, 1998)
(Patent Document 2) (Document 2) Korean Patent Application Publication No. 10-2008-0018520 (Feb. 28, 2008).

SUMMARY OF THE INVENTION

Accordingly, the present invention has been made keeping in mind the above problems occurring in the prior art, and an object of the present invention is to provide a connector pin device for testing a semiconductor chip, which can perform the electrical characteristics of a semiconductor chip reliably and stably and improve an economic feasibility by extending durability lifespan, and a method of manufacturing the same.

Another object of the present invention is to provide a connector pin device for testing a semiconductor chip, which can implement a pair of contact pins coming into contact with contact points on the upper and lower end sides with the least volume, can made dense the distance between conduction parts through such volume minimization, can improve an electrical resistance characteristic, and can maintain a stable frequency characteristic even in a high frequency, and a method of manufacturing the same.

Furthermore, another object of the present invention is to provide a connector pin device for testing a semiconductor chip, wherein the contact parts of a pair of contact pins that are relatively movable are provided in the space and also configured to be stably brought in contact with each other and supported, and sliding properties between pins can be certainly secured due to oiling processing in the contact part between the pins and the formation of the space, and a method of manufacturing the same.

Objects of the present invention are not limited to the aforementioned effects, and other objects not described above may be evidently understood by those skilled in the art to which the embodiments pertain from the following description.

In accordance with an aspect of the present invention, there is provided a connector pin device for testing a semiconductor chip, including a test socket body made of a flexible insulating material and including a pin mounting part in which a plurality of mounting holes has been formed and a support part supporting the pin mounting part in the circumference of the pin mounting part, a plurality of sliding contact pins respectively formed in the plurality of mounting holes and each including a first contact pin having a first end externally exposed and a second end located within the mounting hole and a second contact pin having a first end externally located on the side opposite the first end of the first contact pin and a second end located within the mounting hole, wherein the first and second ends of the first and the second contact pins are provided to slide and come into contact with each other, and a cavity portion formed in a portion where the second ends of the sliding contact pins in the mounting hole are located.

In an aspect of the present invention, the connector pin device may further include a guide member for laterally supporting the first end of each of the first and the second contact pins on a surface of the pin mounting part where the first end is located.

In an aspect of the present invention, the second ends of the first and the second contact pins are provided in such a way as to come into contact with each other, a middle part between the first end and the second ends is buried in the pin mounting part made of silicon, and the sum of two widths of the second ends of the first and the second contact pins is smaller than a width of the first end.

In an aspect of the present invention, the first and the second contact pins may further include fixation power enhancement parts for increasing a fixation power with respect to the pin mounting part, and a support member supporting the second ends of the first and the second contact pins so that the second ends slidingly come into contact with each other may be further included in the cavity portion.

In an aspect of the present invention, the support member may be composed of a pad of a flexible material which is protruded from a wall surface forming the cavity portion. A middle part of the support member may include a through hole coming into contact with the external surface of the second ends in the state in which the second ends of the first and the second contact pins have been brought into contact with each other.

In an aspect of the present invention, the pin mounting part may further include silicon oil made of silicon and provided in a contact part between the second ends of the first and the second contact pins.

In accordance with another aspect of the present invention, there is provided a method of manufacturing a connector pin device for testing a semiconductor chip, including a contact pin providing step of providing pairs of contact pins having a specific shape, a pin body providing step of providing an upper body made of a flexible insulating material and in which one end and other end of each of the pairs of contact pins provided in the contact pin providing step are fixed and exposed and hollow grooves are formed in one surface and disposed on a side where the other ends are located and a lower body made of a flexible insulating material and in which the other end and one end of each of the pairs of contact pins are fixed and exposed and hollow grooves are formed in one surface facing the upper body and formed on a side where the other ends are located, a guide layer forming step of forming guide layers in the other surface of each of the upper body and the lower body provided in the pin body providing step, and an integrating step of integrating the upper body and the lower body in the state in which one surfaces of the upper body and the lower body are made to face each other, the other ends of the contact pins are brought into contact with each other, and a plate-shaped support member including a through hole supporting the other ends of the contact pins is interposed between the upper body and the lower body.

In accordance with another aspect of the present invention, the method may further include coating oil on a contact part between the other ends of the pairs of contact pins prior to the integrating step. In the pin body providing step, after the body is formed in a block form by insert molding or coating using silicon rubber so that a portion other than the one ends and the other ends is buried using a mold, the hollow grooves may be formed in one surface of the body having the block form into which the contact pins have been inserted using a laser processing method or a fine pattern etching method.

In yet another aspect of the present invention, the guide layer forming step includes fixing a film of a specific thickness having a through hole through which the one ends of the pairs of contact pins penetrate so that they are exposed using adhesives. In the integrating step, the upper body and the lower body are integrated using silicon adhesives in the state in which one surfaces of the upper body and the lower body are made to face each other, and a plate-shaped support member has been interposed between the one surfaces, wherein the upper body and the lower body are integrated in the state in which the other ends of the contact pins provided in the upper body and the lower body are located to slidingly come into contact with each other. The other ends of a pair of the contact pins are located in a cavity portion formed by the coupling of the hollow grooves of the upper body and the lower body. In the cavity portion, the other ends of the contact pins are brought into contact with each other and supported by a plate-shaped support member in which the through hole has been formed.

DESCRIPTION OF REFERENCE NUMERALS

100: test socket body    110: support part
120: pin mounting part   130: pin guide member
131: adhesive layer      132: film layer
200: pair of sliding contact pin
210: first contact pin
211, 221: uneven part    220: second contact pin
300: cavity portion      400: support member
510, 520: contact pin    530: hollow groove
600: guide layer
700: plate-shaped support member
S100: contact pin providing step
S200: pin body providing step
S300: guide layer forming step
S400: integrating step
H: head part             L: leg part
W1: width of sum of leg parts of two contact pin
W2: width of head part

DETAILED DESCRIPTION

Additional objects, characteristics and advantages of the present invention may be clearly understood from the following detailed description and the accompanying drawings.

Prior to a detailed description of the present invention, the present invention may be modified in various manners and may have various embodiments. Examples described hereinafter and shown in the drawings are not intended to limit the present invention to specific embodiments, but should be understood to include all of changes, equivalents and/or substitutions included in the spirit and technological scope of the present invention.

When it is said that one element is "connected" or "coupled" to the other element, it should be understood that one element may be directly connected or coupled" to the other element, but a third element may exist between the two elements. In contrast, when it is described that one element is "directly connected" or "directly coupled" to the other element, it should be understood that a third element does not exist between the two elements.

The terms used in the specification are used to only describe specific embodiments and are not intended to restrict the present invention. An expression of the singular number should be construed as including an expression of the plural number unless clearly defined otherwise in the context. It is to be understood that in the specification, a term, such as "include or (comprise)" or "have", is intended to designate that a characteristic, number, step, operation, element or part which is described in the specification or a combination of them are present and does not exclude the existence or possible addition of one or more other characteristics, numbers, steps, operations, elements, parts or combinations of them in advance.

Furthermore, the term " . . . unit", " . . . unit", " . . . module", etc. described in the specification means a unit for processing at least one function or operation, and this may be implemented by hardware or software or a combination of them, Furthermore, in describing the accompanying drawings, the same element is assigned the same reference numeral regardless of its reference numeral in a corresponding drawing, and a redundant description thereof is omitted. In describing the present invention, a detailed description of a known art related to the present invention will be omitted if it is deemed to make the gist of the present invention unnecessarily vague.

A connector pin device for testing a semiconductor chip and a method of manufacturing the same according to embodiments of the present invention are described below with reference to the accompanying drawings.

Figure 3:
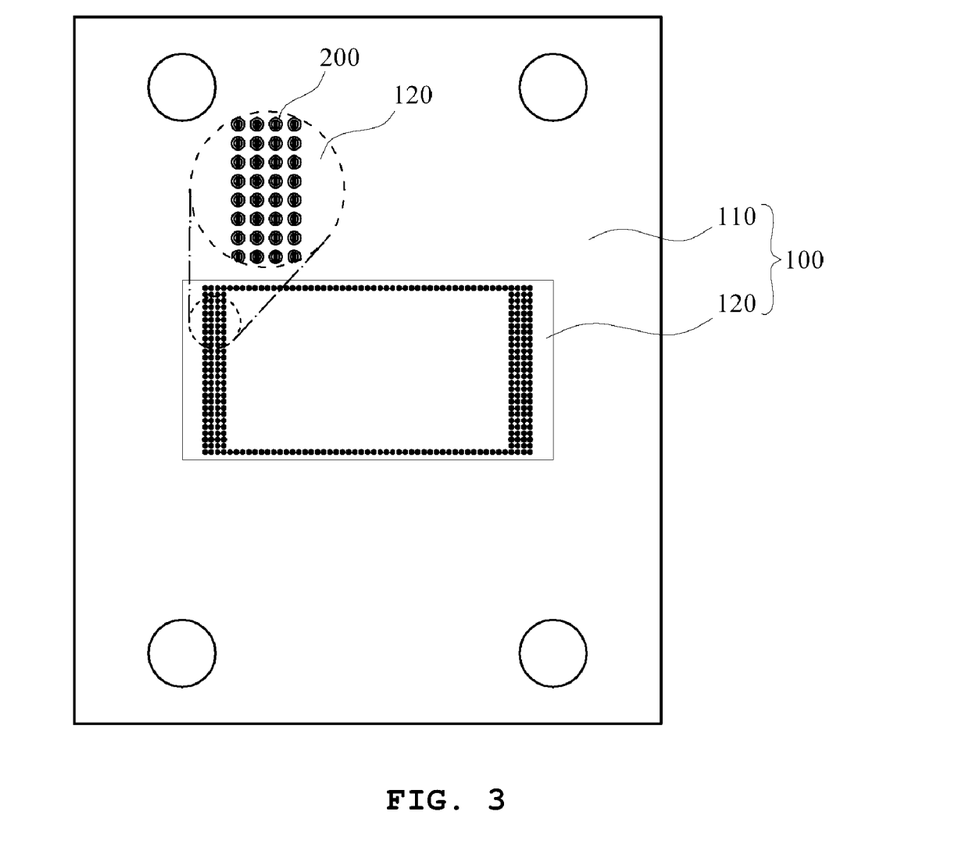
FIG. 3 is a plan view showing a chip connector pin device for testing a semiconductor chip according to an embodiment of the present invention.
Figure 4:
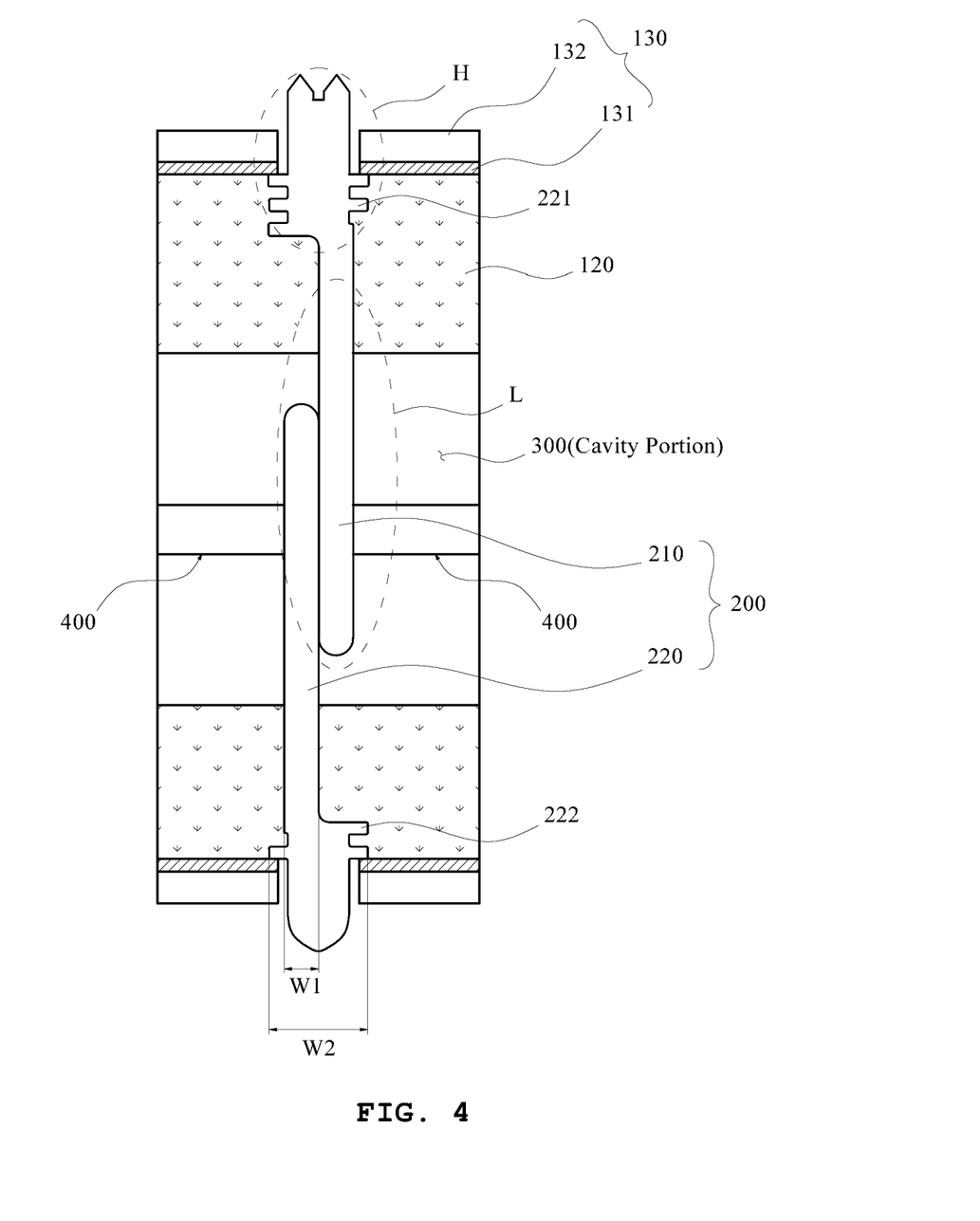
FIG. 4 is a cross-sectional view showing major elements of the chip connector pin device for testing a semiconductor chip according to an embodiment of the present invention.
Figure 5:
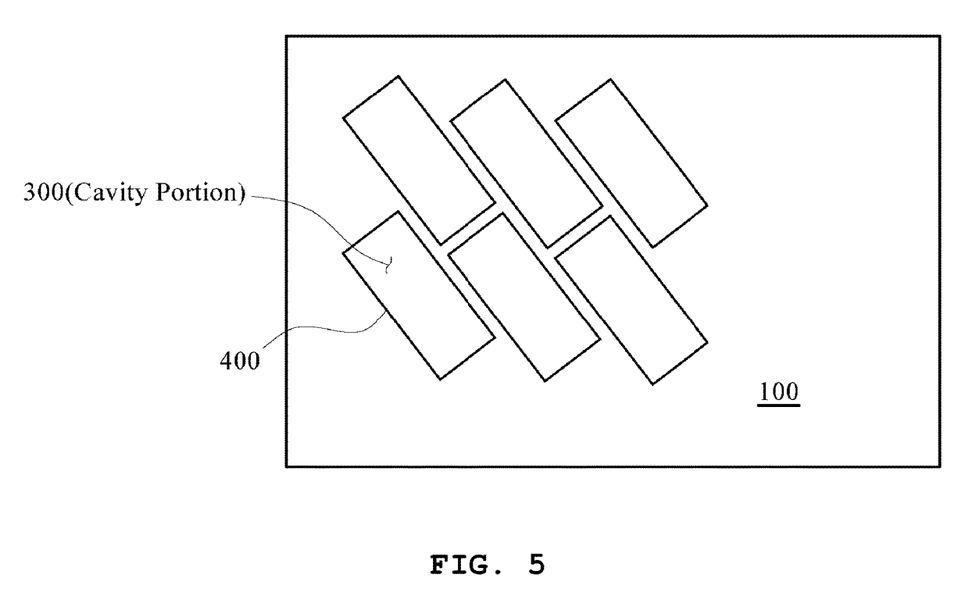
FIG. 5 is a plan cross-sectional view showing a pin support member forming the connector pin device for testing a semiconductor chip according to an embodiment of the present invention.
Figure 6:
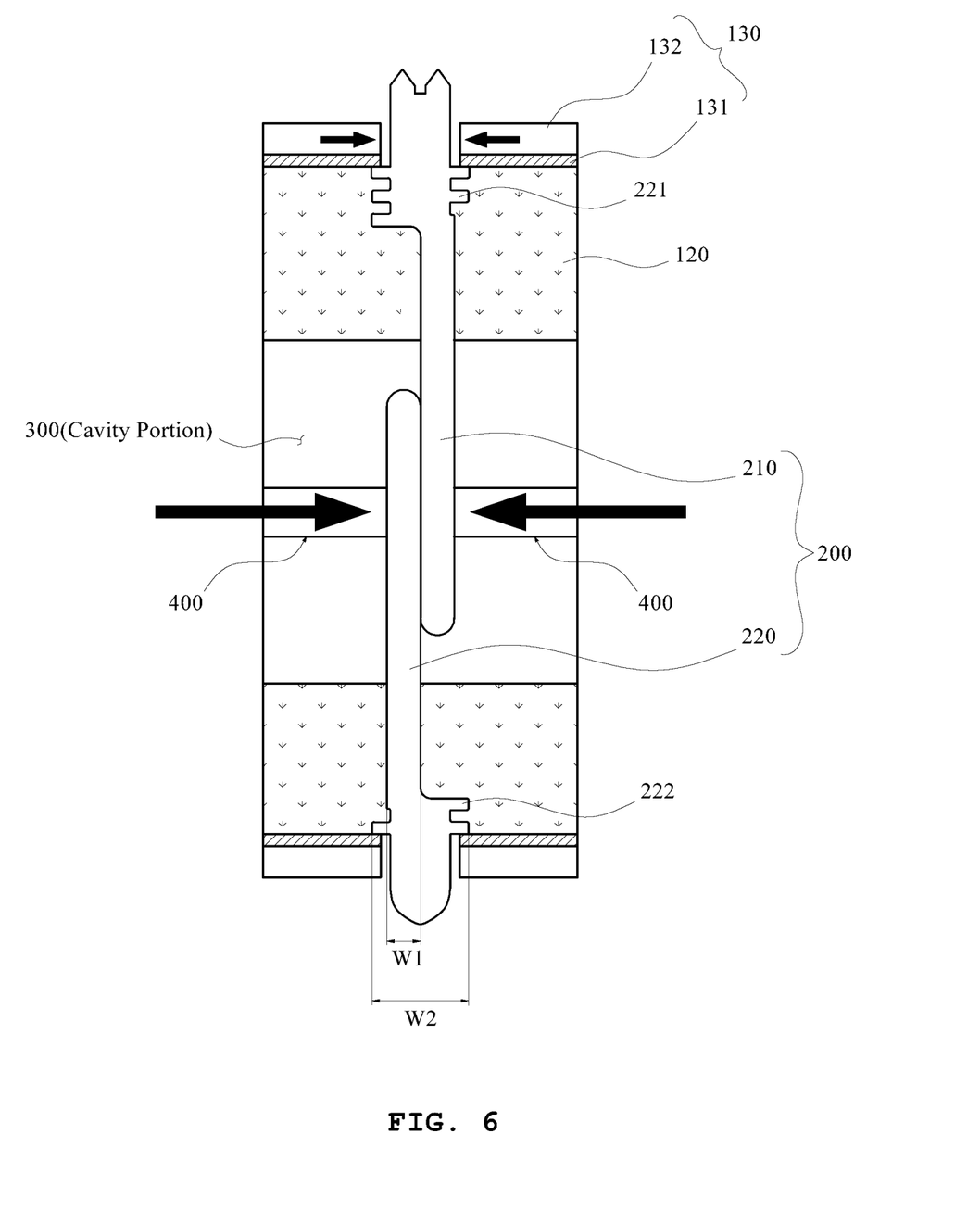
FIG. 6 is a diagram showing an operational relation according to a guide member and support member that form the connector pin device for testing a semiconductor chip according to an embodiment of the present invention.

First, a connector pin device for testing a semiconductor chip according to an embodiment of the present invention is described with reference to FIGS. 3 to 5. FIG. 3 is a plan view showing a chip connector pin device for testing a semiconductor chip according to an embodiment of the present invention. FIG. 4 is a cross-sectional view showing major elements of the chip connector pin device for testing a semiconductor chip according to an embodiment of the present invention. FIG. 5 is a plan cross-sectional view showing a pin support member forming the connector pin device for testing a semiconductor chip according to an embodiment of the present invention. FIG. 6 is a diagram showing an operational relation according to a guide member and support member that form the connector pin device for testing a semiconductor chip according to an embodiment of the present invention.

As shown in FIGS. 3 to 6, the connector pin device for testing a semiconductor chip according to an embodiment of the present invention includes a test socket body 100, a plurality of mounting holes (not shown) respectively formed in the pin mounting parts 120 of the test socket body 100, a plurality of sliding contact pins 200 each provided in each of the plurality of mounting holes, and a cavity portion 300 formed in a mounting hole in which the other-side ends of each of the plurality of sliding contact pins 200 are located. In this case, each of the plurality of sliding contact pins 200 includes a first contact pin 210 having a one-side end (i.e., a first end) externally exposed and the other-side end (i.e., a second end) located within the mounting hole and a second contact pin 220 having a one-side end (i.e., a first end) externally located on the side opposite the one-side end of the first contact pin 210 and the other-side end (i.e., a second end) located within the mounting hole. The sliding contact pin 200 is provided so that the other-side ends of the first contact pin 210 and the second contact pin 220 slidingly come into contact with each other.

The test socket body 100 basically includes a pin mounting part 120 in which the pairs of sliding contact pins 200 are provided in the mounting holes and a support part 110 supporting and fixing the pin mounting part 120 in the circumference of the pin mounting part 120.

The support part 110 is not specially limited to any part if it has a material or construction for stably supporting and fixing the pin mounting part 120. For example, the support part 110 may be made of resins.

The pin mounting part 120 of the test socket body 100 may be made of silicon, that is, an insulator having elasticity.

In an embodiment of the present invention, pin guide members 130 each for guiding the side of an exposed end, that is, the one-side end (i.e., the first end) of the sliding contact pin 200, while stably supporting the exposed end when the sliding contact pin 200 slidingly moves by an external force are further provided in the circumference of the mounting holes at the top and bottom of the pin mounting parts 120 of the test socket body 100.

As shown in FIG. 4, the pin guide member 130 includes a through hole that permits a movement of the sliding contact pin 200 at the top and bottom of the pin mounting part 120 of the test socket body 100, that is, a through hole through which the exposed end, that is, the one-side end of the contact pin 200, penetrates, and film layers 132 fixed to the top and bottom of the pin mounting part 120 of the test socket body 100 through an adhesive layer 131.

The adhesive layer 131 may be made of silicon adhesives or may be made of a thin film on both of which adhesives have been coated.

The film layer 132 of the pin guide member 130 is made of a material relatively more rigid than the material (e.g., silicon) of the pin mounting part 120, and has a specific thickness by taking into consideration design characteristics.

The film layer 132 may be made of any one of silicon rubber, polyimide, polyethylene, polypropylene and polyester, for example.

Each of the sliding contact pins 200 includes the first contact pin 210 having the one-side end (i.e., the first end or exposed end) upward exposed from the pin mounting part 120 and the other-side end (i.e., the second end or sliding contact part) provided in the cavity portion 300 of a mounting hole and the second contact pin 220 having the one-side end (i.e., the first end or exposed end) externally exposed to the bottom of the test socket body 100 and the other-side end (i.e., the second end or sliding contact part) provided in the cavity portion 300 of the mounting hole. The other-side ends of the first contact pin 210 and the second contact pin 220 are provided to slidingly come into contact with each other. A middle part between the one-side end and the other-side end is buried in the pin mounting part 120 made of silicon.

In this case, when viewing the test socket body 100 in a plane, the first contact pin 210 and the second contact pin 220 are configured to have the same width. In other words, each of the first contact pin 210 and the second contact pin 220 has a head part H and a leg part L. The width of the sum of the widths W1 of the leg parts of the contact pins 210 and 220 may be equal to or less than the width W2 of the head part. That is, the sum of the widths W1 of the other-side ends (specifically, the leg parts L located in the cavity portion 300) of the first contact pin 210 and the second contact pin 220 may be smaller than the width W2 of the one-side end (specifically, the head part H including the externally exposed part) of each of the first contact pin 210 and the second contact pin 220.

As described above, the sliding contact pin 200 including the two contact pins 210 and 220 can promote volume minimization because the two contact pins coming into contact with different contact points is configured to relatively move, can improve an electrical resistance characteristic through such volume minimization, and can maintain a stable frequency characteristic even in a high frequency.

Furthermore, the tip of the exposed end of the first contact pin 210 of the sliding contact pin 200 is bifurcated. The ends of the bifurcated part include a pair of contact ends that are tapered down to points and come into contact with an object or target to be tested. The tip of the exposed end of the second contact pin 220 of the sliding contact pin 200 includes a single contact end that has a pointed shape and comes into contact with an object or target to be tested. Such contact ends may have the same shape, which is a pointed shape and vice verse.

The first contact pin 210 and second contact pin 220 of the sliding contact pin 200 is not specially limited to any conductive material if it has excellent conductivity and can minimize pollution. For example, the contact pins may be formed by performing nickel and gold plating on a material, such as beryllium copper (Be—Cu), tungsten or stainless.

The first contact pin 210 and the second contact pin 220 may be formed by performing nickel and gold plating on beryllium copper. For example, the contact pins may be formed by performing the coating of a platinum-group element, such as palladium, rhodium or platinum, or cobalt coating or diamond like carbon (DLC) coating so that lead, a flux, etc. from a semiconductor conductive ball or a pad does not adhere to the contact pins. However, the present invention is not limited to the examples, the contact pins may be made of a metal material having conductivity and lubricant.

In an embodiment of the present invention, the sliding contact pin 200 further includes a fixation power enhancement part for stably fixing the sliding contact pin 200 to the pin mounting part 120.

The fixation power enhancement part includes uneven parts 221 and 222 formed in concave and convex forms in the contact pins 210 and 220 buried in the pin mounting part 120, for example. Accordingly, a contact area with the pin mounting part 120 made of silicon can be further increased and confinement in the sliding direction can be certainly performed because the sliding contact pin 200 includes the uneven parts 221 and 222 as described above.

The uneven parts 221 and 222 of the fixation power enhancement part may be formed on the head part (H) sides of the contact pins 210 and 220.

The constructions of the contact pins 210 and 220 formed in the pin mounting part 120 are described below.

In an embodiment of the present invention, the connector pin device further includes a support member 400 for stably maintain a contact sliding movement of each sliding contact pin 200 in the cavity portion 300 in which each other-side end of the sliding contact pin 200 is located.

In an embodiment, the support member 400 is inwardly protruded from a wall surface that forms the cavity portion 300 and has a through hole configured to bring into contact with the external surface of the other-side ends of the sliding contact pin 200 (i.e., the second ends or sliding contact parts) at the middle part of the support member 400. The support member may be a plate type pad made of an insulating and flexible material and having a specific thickness.

For example, silicon rubber or a polyimide film may be used as the support member 400.

In the case of the support member 400 formed of the plate type pad, the side located on the inside wall of the cavity portion is relatively thicker than the side on which the through hole is formed. Alternatively, the support member 400 may be tapered to have a greater thickness from the side on which the through hole is formed toward the wall surface.

Since the thickness of the support member 400 is different as described above, the contact state of each sliding contact pin 200 can be stably maintained when the sliding contact pins 200 perform a mutual contact sliding movement by the elastic contraction and deformation of the pin mounting parts 120. Furthermore, the pin mounting parts 120 can be restored and the contact pin 200 can smoothly return to its original position because a smooth restoring force in the middle part having a relatively better restoring force than the edge of the support member 400 is secured when the pin mounting part 120 is restored.

A construction in which the support member 400 is provided in the cavity portion 300 is described below.

In an embodiment of the present invention, silicon oil is further provided in the contact part between the sliding contact parts of the sliding contact pin 200, that is, between the other-side ends of the first contact pin 210 and the second contact pin 220 in order to implement further smooth contact sliding when the sliding contact pin 200 performs a mutual contact sliding movement.

In an embodiment of the present invention, the silicon oil provided in the sliding contact part of the sliding contact pin 200 may further include silicon oil providing means for providing oil to the contact part between the contact pins in order to supplement the consumption of the oil attributable to a contact friction between the contact pins.

A method of manufacturing a connector pin device for testing a semiconductor chip according to an embodiment of the present invention is described below with reference to FIGS. 7 to 10. In the following description of the method of manufacturing a connector pin device for testing a semiconductor chip, contents redundant with the contents described in connection with the connector pin device for testing a semiconductor chip are omitted or described in brief.

Figure 7:
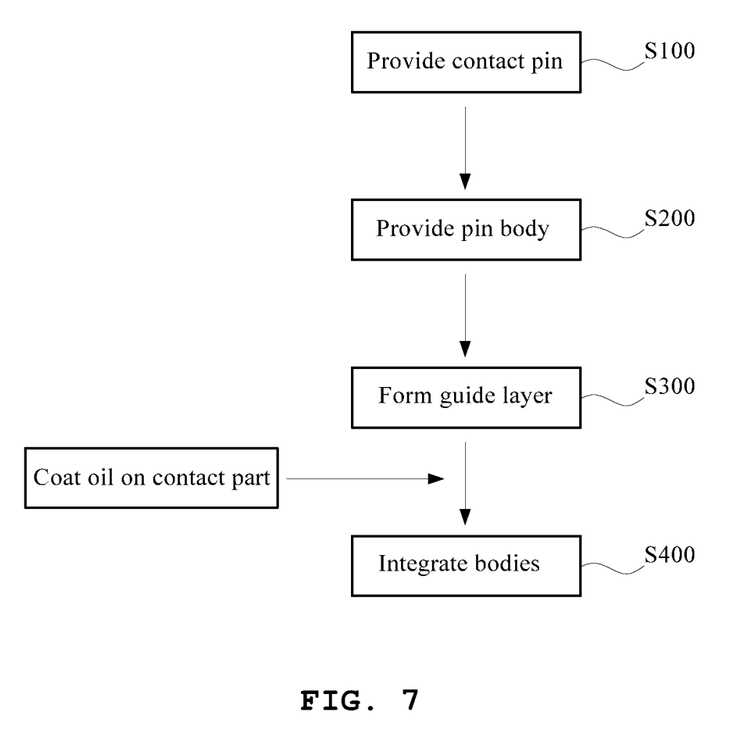
FIG. 7 is a flowchart illustrating a method of manufacturing a connector pin device for testing a semiconductor chip according to an embodiment of the present invention.
Figure 8:
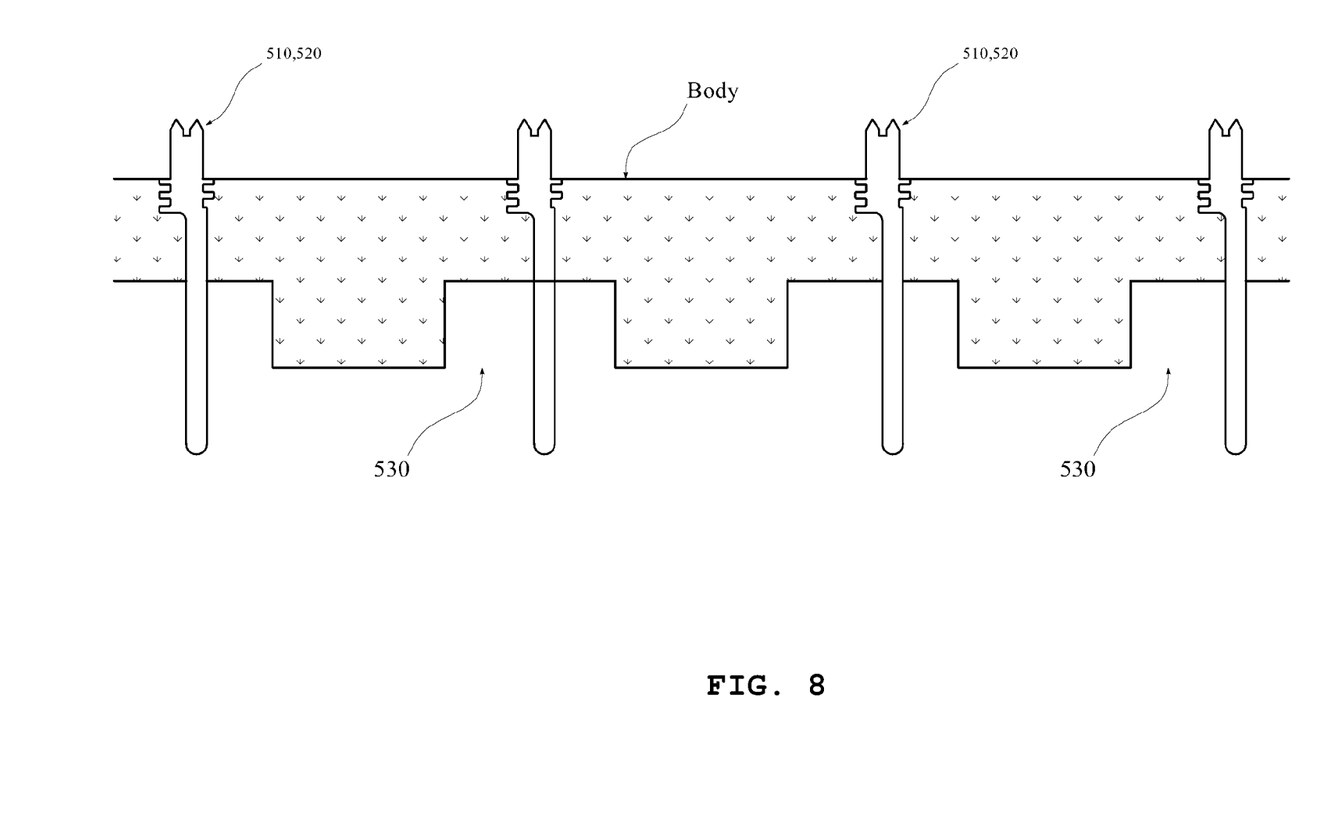
FIG. 8 is a diagram showing a pin body provided in a pin body providing step in the method of manufacturing a connector pin device for testing a semiconductor chip according to an embodiment of the present invention.
Figure 9:
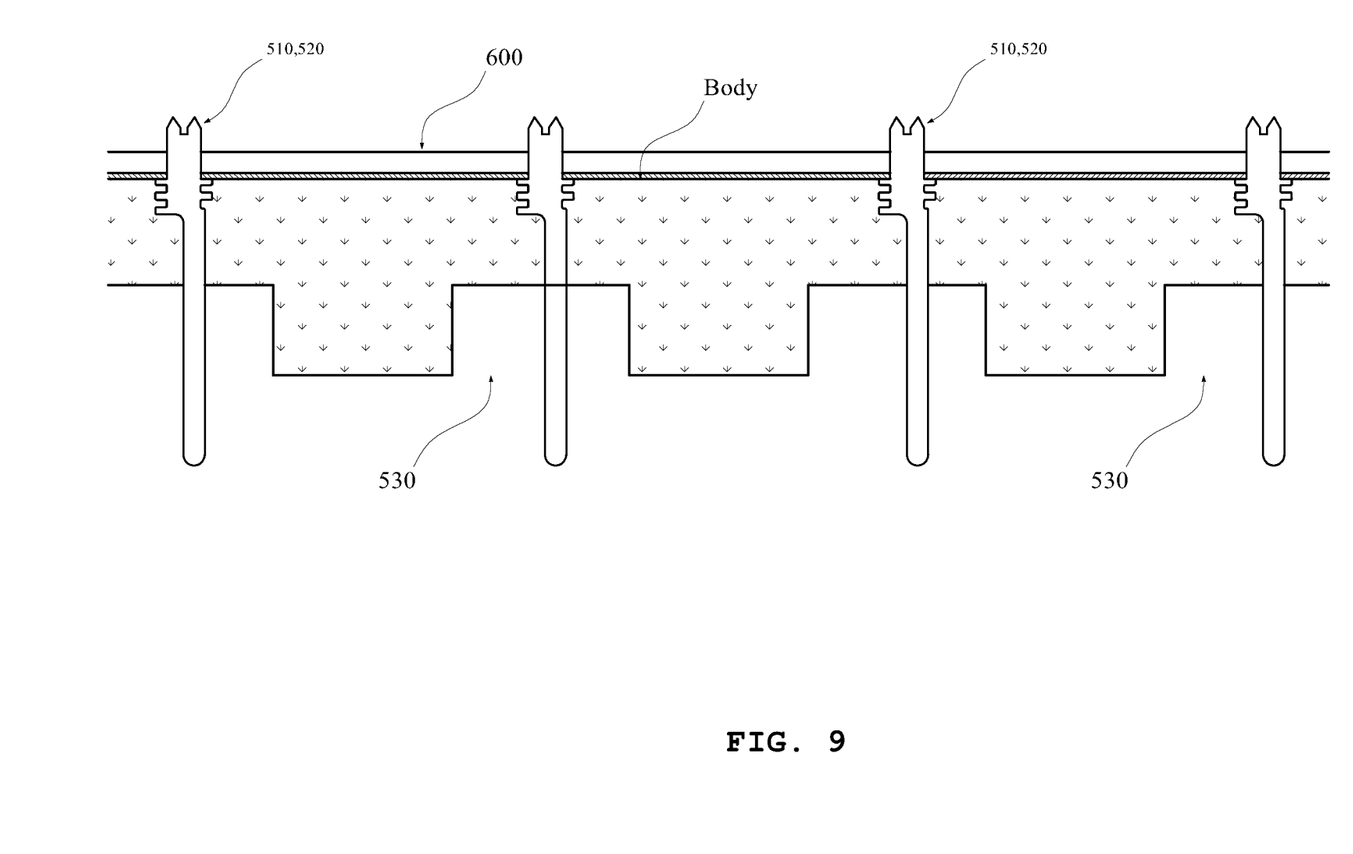
FIG. 9 is a diagram showing a body in which a guide layer has been formed in the method of manufacturing a connector pin device for testing a semiconductor chip according to an embodiment of the present invention.
Figure 10:
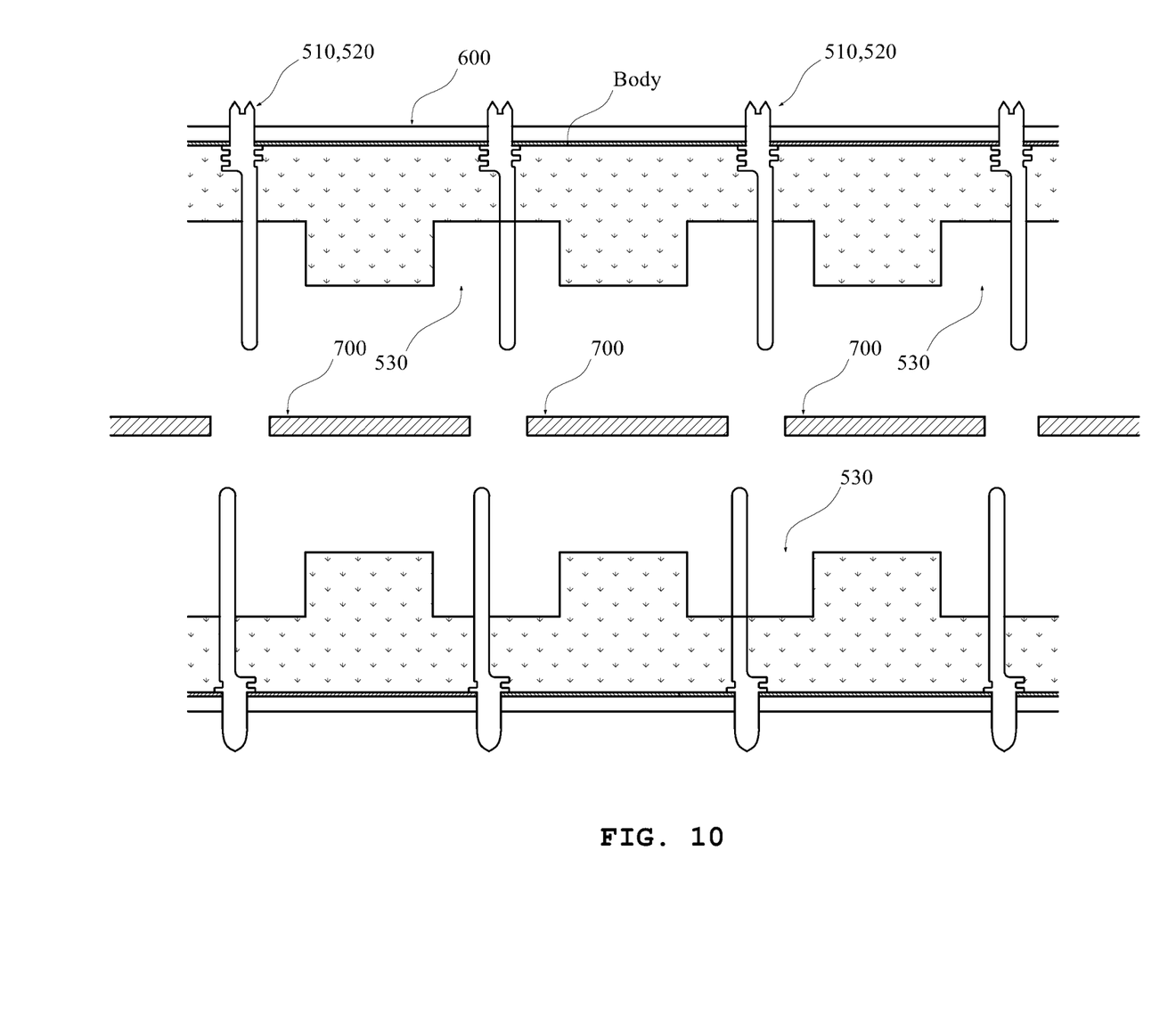
FIG. 10 is a diagram showing a process of integrating an upper body and a lower body in the state in which a support member has been interposed in the method of manufacturing a connector pin device for testing a semiconductor chip according to an embodiment of the present invention.

FIG. 7 is a flowchart illustrating a method of manufacturing a connector pin device for testing a semiconductor chip according to an embodiment of the present invention. FIG. 8 is a diagram showing a pin body provided in a pin body providing step in the method of manufacturing a connector pin device for testing a semiconductor chip according to an embodiment of the present invention. FIG. 9 is a diagram showing a body in which a guide layer has been formed in the method of manufacturing a connector pin device for testing a semiconductor chip according to an embodiment of the present invention. FIG. 10 is a diagram showing a process of integrating an upper body and a lower body in the state in which a support member has been interposed in the method of manufacturing a connector pin device for testing a semiconductor chip according to an embodiment of the present invention.

As shown in FIGS. 7 to 10, the method of manufacturing a connector pin device used for a semiconductor chip according to an embodiment of the present invention includes a contact pin providing step S100 of providing pairs of contact pins 510 and 520 of a specific shape, a pin body providing step S200 of providing an upper body and lower body in which the one-side end (i.e., the first end) and other-side end (i.e., the second end) of each of the contact pins 510 and 520 provided in the contact pin providing step S100 are exposed and in which hollow grooves 530 are formed in one surface and each located at a location where the other-side end (i.e., the second end) of the contact pin is located, a guide layer forming step S300 of forming a guide layer 600 in each of the other surfaces of the upper body and the lower body provided in the pin body providing step S200, and an integrating step S400 of integrating the upper body and the lower body in the state in which one surfaces of the upper body and the lower body are made to face each other to bring the other-side ends of the pairs of contact pins into contact with each other and plate-shaped support members 700 each having a through hole through which the other-side ends of the contact pins penetrate and are supported have been interposed. Prior to the integrating step S400, oil is coated on the contact part between the other ends of the contact pins.

In the contact pin providing step S100, the contact pins may be provided by cutting processing using a laser device (not shown) so that they have a uniform width and have ends tapered down to points using a plate-shaped metal body as a substrate.

In this case, a detailed construction of the contact pin has been described above, and a redundant description thereof is omitted.

In the pin body providing step S200, after the body is formed in a block form by insert molding or coating using silicon rubber so that a portion other than the one-side ends and the other-side ends is buried using a mold, the hollow grooves may be formed in one surface of the body having the block form into which the contact pins have been inserted using a laser processing method or a fine pattern etching method.

Next, in the guide layer forming step S300, a film of a specific thickness having a through hole that permits a movement of the contact pins, that is, that penetrates the contact pins so that the exposed end of each of the one-side ends of the contact pins is exposed, is fixed to one surface of each of the upper body and the lower body provided as described above using adhesives.

The adhesives may be silicon adhesives or may be a thin film on both surfaces of which the adhesives have been coated.

The film may be made of a material relatively more rigid than the material (e.g., silicon) of the body. For example, the film may be made of any one of polyimide, polyethylene, polypropylene and polyester.

Next, in the inter-body integrating step S400, after one surfaces of the upper body and the lower body provided as described above are made to face each other, the upper body and the lower body are integrated using silicon adhesives in the state in which the plate-shaped support member 700 has been interposed between the one surfaces.

In this case, the other-side ends (i.e., the second end or the sliding contact part) are integrated in the state in which the contact pins provided in the upper body and the lower body are brought into contact with each other. The other-side end between the contact pins is located in the cavity portion formed by the mutual coupling of the hollow grooves of the body. The other-side ends of the contact pins are brought into contact with each other and supported in the cavity portion by the plate-shaped support members 700 in which the through hole is formed.

A detailed construction of the plate-shaped support member has been described above, and a redundant description thereof is omitted.

In accordance with the connector pin device for testing a semiconductor chip and the method of manufacturing the same according to the embodiments of the present invention, there are advantages in that the electrical characteristics of a semiconductor chip can be performed reliably and stably and an economic feasibility can be improved by extending durability lifespan.

Furthermore, in accordance with the embodiments of the present invention, there are advantages in that an electrical resistance characteristic can be improved through volume minimization and a stable frequency characteristic can be maintained even in a high frequency because pairs of the contact pins coming into contact with different contact points are configured as a single body that can relatively move.

Furthermore, in accordance with the embodiments of the present invention, the pins formed of a relatively movable body is provided in the space and stably brought into contact with each other and supported, and oil is processed on the contact part between the pins and provided in the space. Accordingly, there is an advantage in that product competitiveness can be improved because sliding properties between the pins can be secured more reliably.

Effects of the present invention are not limited to the aforementioned effects, and other objects not described above may be evidently understood by those skilled in the art to which the embodiments pertain from the following description.

The embodiments described in the specification and the accompanying drawings merely illustrate some of the technological spirit included in the present invention. Accordingly, the embodiments disclosed in the specification are not intended to limit the technological spirit of the present invention, but illustrate the technological spirit of the present invention. Accordingly, it is evident that the scope of the technological spirit of the present invention is not restricted by the embodiments. All of modified examples and detailed embodiments which may be easily inferred by those skilled in the art without departing from the scope of the technological spirit included in the specification and drawings of the present invention should be construed as being included in the range of right of the present invention.

What is claimed is:

1. A connector pin device for testing a semiconductor chip, comprising:
    a test socket body made of a flexible insulating material and comprising a pin mounting part in which a plurality of mounting holes has been formed and a support part supporting the pin mounting part in a circumference of the pin mounting part;
    a plurality of sliding contact pins respectively formed in the plurality of mounting holes and each comprising a first contact pin having a first end externally exposed and a second end located within the mounting hole and a second contact pin having a first end externally located on a side opposite the first end of the first contact pin and a second end located within the mounting hole, wherein a middle part between the first and second ends of the first and the second contact pins is fixed to the pin mounting part, and the second ends of the first and the second contact pins slidingly come into contact with each other;
    a cavity portion formed in a portion where the second ends of the sliding contact pins in the mounting hole are located; and
    a support member supporting the second ends of the first and the second contact pins so that the second ends slidingly come into contact with each other in the cavity portion,
    wherein the support member is protruded from a wall surface forming the cavity portion, and
    a middle part is formed to come into contact with and support an external surface of the second end with the second ends of the first and the second contact pins which are brought into contact with each other.

2. The connector pin device of claim 1, further comprising a guide member for laterally supporting the first end of each of the first and the second contact pins on a surface of the pin mounting part where the first end is located.

3. The connector pin device of claim 1, wherein:
    the second ends of the first and the second contact pins are provided in such a way as to come into contact with each other,
    a middle part between the first end and the second ends is buried in the pin mounting part made of silicon, and
    a sum of two widths of the second ends of the first and the second contact pins is smaller than a width of the first end.

4. The connector pin device of claim 1, wherein the first and the second contact pins further comprise fixation power enhancement parts for increasing a fixation power with respect to the pin mounting part.

5. The connector pin device of claim 1, wherein the support member comprises a pad of a flexible material having a through hole into which the second ends of the first and the second contact pins are inserted.

6. The connector pin device of claim 1, wherein:
    the pin mounting part is made of silicon, and
    silicon oil is further provided in a contact part between the second ends of the first and the second contact pins.

7. A method of manufacturing a connector pin device for testing a semiconductor chip, the method comprising:
    a contact pin providing step of providing pairs of contact pins having a specific shape;
    a pin body providing step of providing an upper body made of a flexible insulating material and in which one end and other end of each of the pairs of contact pins provided in the contact pin providing step are fixed and exposed and hollow grooves are formed in one surface and disposed on a side where the other ends are located and a lower body made of a flexible insulating material and in which the other end and one end of each of the pairs of contact pins are fixed and exposed and hollow grooves are formed in one surface facing the upper body and formed on a side where the other ends are located; and
    an integrating step of integrating the upper body and the lower body in a state in which one surfaces of the upper body and the lower body are made to face each other, the other ends of the contact pins are brought into contact with each other, and a plate-shaped support member comprising a pad of a flexible material comprising a through hole supporting the other ends of the contact pins is interposed between the upper body and the lower body,
    wherein in the body integrating step, the upper body and the lower body are integrated using silicon adhesives in the state in which the one surfaces of the upper body and the lower body are made to face each other and the plate-shaped support member has been interposed between the upper body and the lower body,
    the upper body and the lower body are integrated in the state in which the other ends of the contact pins provided in the upper body and the lower body slidingly come into contact with each other,
    the other ends of the two contact pins are located in an cavity portion formed by mutual coupling of the hollow grooves of the upper body and the lower body, and
    the other ends of the contact pins are brought into contact with other and supported in the cavity portion by the plate-shaped support member in which the through hole has been formed.

8. The method of claim 7, wherein in the pin body providing step, after the body is formed in a block form by insert molding or coating using silicon rubber so that a portion other than the one ends and the other ends is buried using a mold, the hollow grooves are formed in one surface of the body having the block form into which the contact pins have been inserted using a laser processing method or a fine pattern etching method.

9. The method of claim 7, further comprising, between the pin body providing step and the integrating step:
- a guide layer forming step of forming guide layers on other surfaces of the upper body and the lower body provided in the pin body providing step; and
- a step of coating oil on a contact part between the other ends of the pairs of contact pins,
- wherein in the guide layer forming step, a film of a specific thickness having the through hole through which the one ends of the pairs of contact pins penetrate so that the one ends are exposed is fixed using adhesives.

* * * * *